United States Patent
McCord et al.

(10) Patent No.: US 6,664,546 B1
(45) Date of Patent: Dec. 16, 2003

(54) IN-SITU PROBE FOR OPTIMIZING ELECTRON BEAM INSPECTION AND METROLOGY BASED ON SURFACE POTENTIAL

(75) Inventors: Mark A. McCord, Mountain View, CA (US); Jan Lauber, Menlo Park, CA (US); Jun Pei, Campbell, CA (US); Jorge P. Fernandez, San Mateo, CA (US)

(73) Assignee: KLA-Tencor, San Jose, CA (US)

( * ) Notice: Subject to any disclaimer, the term of this patent is extended or adjusted under 35 U.S.C. 154(b) by 0 days.

(21) Appl. No.: 09/502,554

(22) Filed: Feb. 10, 2000

(51) Int. Cl.[7] ................................................. H01J 37/21
(52) U.S. Cl. ........................ 250/397; 250/306; 250/310
(58) Field of Search ................................ 250/306, 310, 250/311, 397

(56) References Cited

U.S. PATENT DOCUMENTS

| | | | |
|---|---|---|---|
| 3,736,422 A | 5/1973 | Weber et al. | |
| 3,952,227 A | 4/1976 | Van Alphen | 315/17 |
| 3,961,190 A | 6/1976 | Lukianoff et al. | |
| 4,255,661 A | 3/1981 | Liebl | |
| 4,551,599 A | 11/1985 | Liebl | |
| 4,743,757 A | 5/1988 | Coates | |
| 4,818,872 A | * 4/1989 | Parker et al. | 250/309 |
| 4,912,405 A | 3/1990 | Richardson | 324/751 |
| 4,963,748 A | 10/1990 | Szilagyi | |
| 5,136,167 A | 8/1992 | Langner et al. | 250/396 R |
| 5,614,833 A | 3/1997 | Golladay | 324/751 |
| 6,038,018 A | * 3/2000 | Yamazaki et al. | 356/237.1 |
| 6,066,849 A | 5/2000 | Masnaghetti et al. | |
| 6,172,365 B1 | * 1/2001 | Hiroi et al. | 250/310 |
| 6,232,787 B1 | * 5/2001 | Lo et al. | 324/751 |
| 6,252,412 B1 | * 6/2001 | Talbot et al. | 324/750 |
| 6,344,750 B1 | 2/2002 | Lo et al. | |
| 6,521,891 B1 | * 2/2003 | Dotan et al. | 250/310 |

FOREIGN PATENT DOCUMENTS

DE 4412415 A1 10/1994 .......... H01J/37/256

OTHER PUBLICATIONS

M. G. R. Thomson, "The electrostatic moving objective lens and optimized deflection systems for microcolumns," Nov./Dec. 1996, Journal of Vacuum Science Technology, B 14(6), Nov./Dec. 1996.

Min Bai, et al, "Resist charging in electron–beam lithography," Sep. 1998, SPIE vol.3546 0277–786X/98.

* cited by examiner

Primary Examiner—John R. Lee
Assistant Examiner—Anthony Quash
(74) Attorney, Agent, or Firm—Beyer, Weaver & Thomas LLP.; Mary R. Olynick, Esq (57) ABSTRACT

Disclosed is a method and apparatus for generating an image from a sample. The apparatus includes a charged particle beam generator arranged to generate and control a charged particle beam substantially towards a portion of the sample and a detector arranged to detect charged particles originating from the sample portion to allow generation of an image from the detected charged particles. The apparatus further includes a measurement device arranged to measure a characteristic of the sample portion to obtain a surface voltage value of the sample portion that is exposed to the charged particle beam. For example, the measurement device is an electrostatic voltmeter positioned to obtain a surface voltage value of the exposed sample portion. A charged particle beam is directed substantially towards a portion of the sample under a first set of operating conditions. A surface charge value of the sample portion is obtained under the first set of operating conditions. It is then determined whether an optimum set of operating conditions associated with a predetermined surface charge value have been found. When the optimum conditions have not been found, the operating conditions are adjusted and the charged particle beam is directed substantially towards the sample portion. When the optimum conditions have been found, the charged particle beam is directed substantially towards the sample portion under the found optimum operating conditions.

31 Claims, 9 Drawing Sheets

IN-SITU PROBE FOR OPTIMIZING ELECTRON BEAM INSPECTION AND METROLOGY BASED ON SURFACE POTENTIAL

BACKGROUND OF THE INVENTION

The present invention relates generally to feature measurement in scanning electron microscopy, and more specifically to apparatus and methods for optimizing image quality. The present invention may also be applied to feature measurement and image enhancement in similar instruments.

Figure 1:
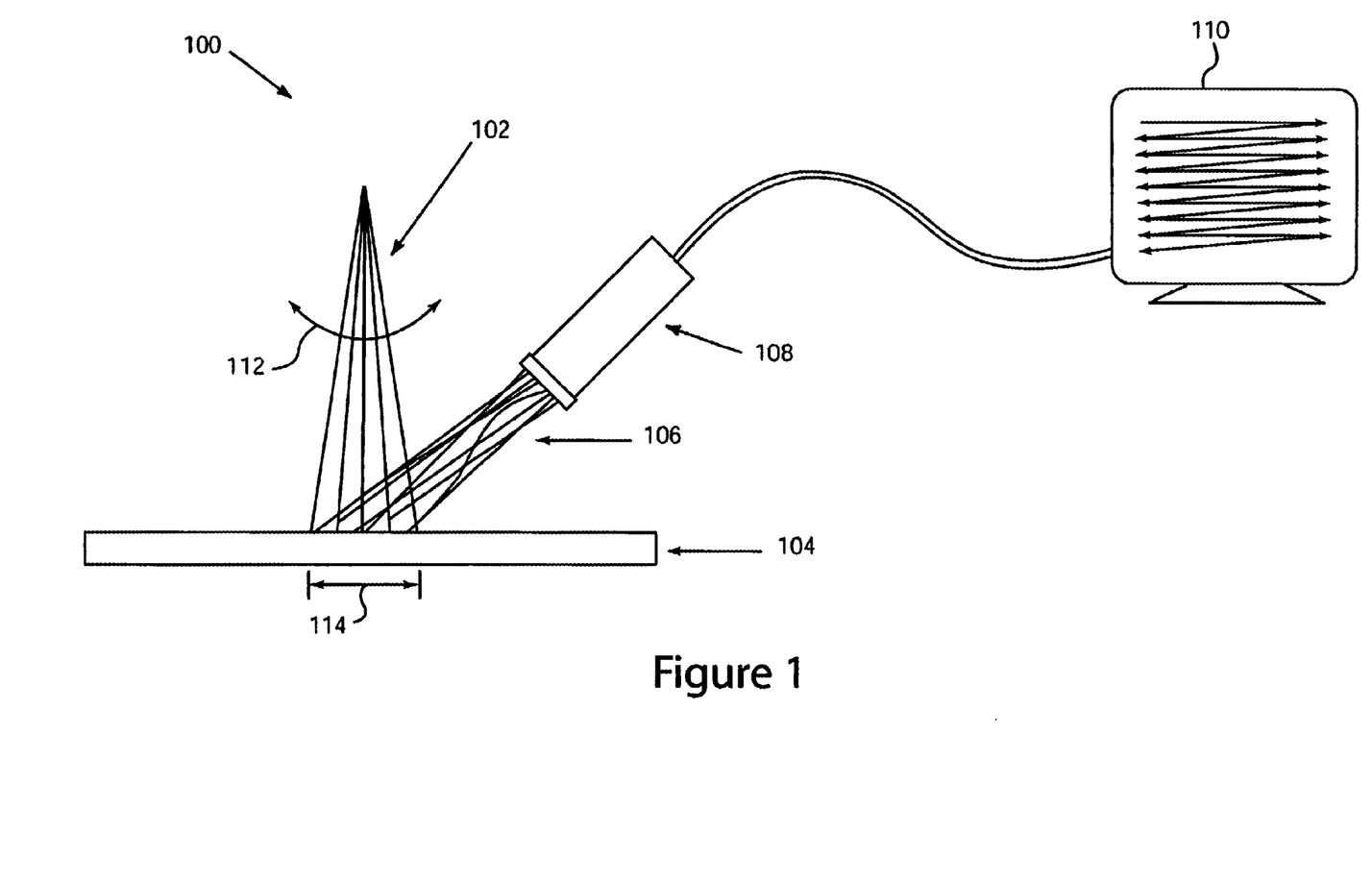
FIG. 1 is a diagrammatic representation of a conventional scanning electron microscopy configuration.

FIG. 1 is a diagrammatic representation of a conventional scanning electron microscopy configuration 100. As shown, a beam of electrons 102 is scanned over a sample 104 (e.g., a semiconductor wafer). Multiple raster scans 112 are typically performed over a small area 114 of the sample 104. The beam of electrons 102 either interact with the sample and cause an emission of secondary electrons 106 or bounce off the sample as backscattered electrons 106. The secondary electrons and/or backscattered electrons 106 are then detected by a detector 108 that is coupled with a computer system 110. The computer system 110 generates an image that is stored and/or displayed on the computer system 110.

Although conventional microscopy systems and techniques typically produce images having an adequate level of quality under some conditions, they produce poor quality images of the sample for some applications. For example, on a sample made of a substantially insulative material (e.g., silicon dioxide), performing one or more scans over a small area causes the sample to accumulate excess positive or negative charge in the small area relative to the rest of the sample. The excess charge generates a potential barrier for some of the secondary electrons, and this potential barrier inhibits some of the secondary electrons from reaching the detector 108. Since this excess charge is likely to cause a significantly smaller amount of secondary electrons to reach the detector, an image of the small area is likely to appear dark, thus obscuring image features within that small area. Alternatively, excess negative charge build up on the sample can increase the collection of secondary electrons causing the image to saturate.

Conventionally, various operating parameters of the microscopy system are manually adjusted until a clear image is obtained. For example, the sample stage voltage or beam source voltage are adjusted to obtain different landing energies that will result in a clearer image. The image quality is typically assessed by the microscopy operator, and the operating parameters are adjusted manually until the operator determines that the image quality is adequate. Since the individual judges image quality and the operating parameters are manually adjusted, this technique tends to be relatively subjective and time-consuming.

Thus, microscopy apparatus and techniques for improving image quality are needed. More specifically, mechanisms for reliably and efficiently controlling charge distribution on the surface of the sample are needed.

SUMMARY OF THE INVENTION

Accordingly, the present invention addresses the above problems by providing apparatus and methods for controlling surface charge on a sample by obtaining surface voltage values of the sample during a charged particle beam metrology or inspection procedure (e.g., in-situ). In general terms, a surface charge value (e.g., by measuring surface voltage) is obtained in-situ under a first set of operating conditions (e.g., a predefined beam landing energy). It may then determined whether the surface charge is at a predetermined optimum value (e.g., zero charge build-up). The operating conditions may then be adjusted until the surface charge reaches the predetermined optimum value or optimum conditions may be extrapolated from previously attempted operating conditions. The charged particle beam metrology or inspection procedure may then be performed under the optimum operating conditions.

In one embodiment, an apparatus for generating an image from a sample is disclosed. The apparatus includes a charged particle beam generator arranged to generate and control a charged particle beam substantially towards a portion of the sample and a detector arranged to detect charged particles originating from the sample portion to allow generation of an image from the detected charged particles. The apparatus further includes a measurement device arranged to measure a characteristic of the sample portion to obtain a surface voltage value of the sample portion that is exposed to the charged particle beam. In a preferred embodiment, the measurement device is an electrostatic voltmeter positioned to obtain a surface voltage value of the exposed sample portion.

In another aspect, the invention is directed towards a method for controlling charge. A charged particle beam is directed substantially towards a portion of the sample under a first set of operating conditions. A surface charge value of the sample portion is obtained under the first set of operating conditions. It is then determined whether an optimum set of operating conditions associated with a predetermined surface charge value have been found. When the optimum conditions have not been found, the operating conditions are adjusted and the charged particle beam is directed substantially towards the sample portion. When the optimum conditions have been found, the charged particle beam is directed substantially towards the sample portion under the found optimum operating conditions. In another embodiment, the present invention pertains to a computer readable medium having computer code for performing these tasks.

In yet another embodiment, a charged particle beam measurement device for obtaining an image of a portion of a sample is disclosed. The charged particle beam measurement device includes a source unit arranged to generate and direct an incident charged particle beam substantially towards a portion of the sample, a first detector arranged to detect charged particles emitted from the sample portion, and an image generator arranged to generate an image from the detected charged particles. The charged particle beam measurement device also includes a second detector arranged to measure a characteristic of the sample portion that is related to a surface voltage value of the sample portion after or while the incident beam hits the sample portion.

In another embodiment, the charged particle beam measurement device includes a source unit arranged to generate and direct an incident charged particle beam substantially towards a portion of the sample, a detector arranged to detect charged particles emitted from the sample portion, and an image generator arranged to generate an image from the detected charged particles. The measurement device also includes a grid positioned between the detector and sample, and the grid is coupled to a voltage source configurable to inhibit charged particles emitted from the sample having an energy less than the energy of the grid.

A method of controlling charge build up on a test sample that is to undergo a metrology or inspection procedure within a charged particle device is disclosed. The method includes(a) in a charged particle device, adjusting a focus setting of a charged particle device to obtain a first optimum image of a reference sample having a known surface charge value, wherein the first optimum image corresponds to an optimum focus setting; (b) selecting a first set of operating conditions for the charged particle device; (c) in the charged particle device, directing a charged particle beam towards a test sample having an unknown surface charge value; (d) in the charged particle device, adjusting the focus setting of the charged particle device to obtain a second optimum image of the test sample, wherein the second optimum image corresponds to a current focus setting; and (e) when the current focus setting equals the optimum focus setting, determining that the unknown surface charge equals the known surface charge and commencing with the metrology or inspection procedure under the first set of operating conditions.

The present invention has several associated advantages. For example, since surface voltage is measured in-situ, surface charge may be accurately and objectively determined to optimize the operating conditions. This is in stark contrast to conventional methods that where the user subjectively determines the quality of the image to adjust operating conditions accordingly. Additionally, optimum conditions are quickly and reliably determined with by automatically obtaining surface voltage values.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF SPECIFIC EMBODIMENTS

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 2:
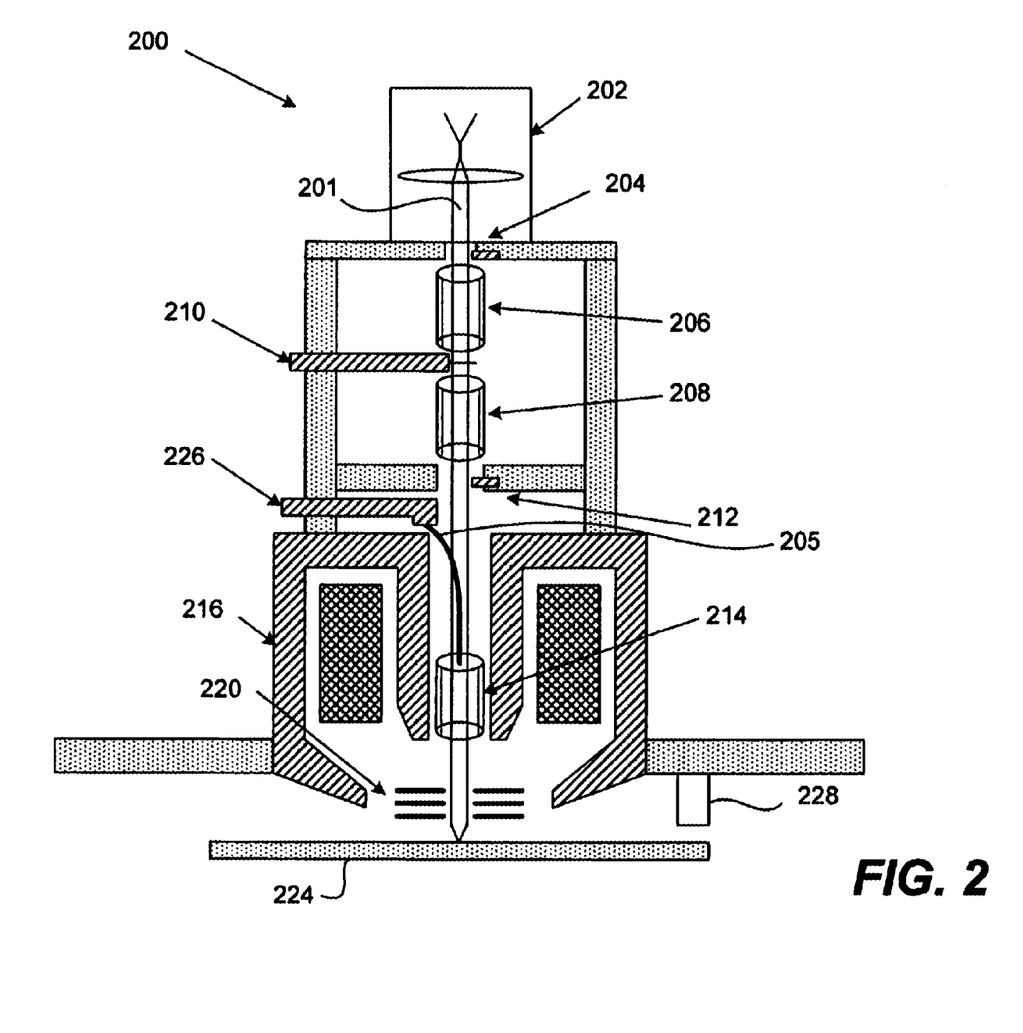
FIG. 2 is a diagrammatic representation of a scanning electron microscope (SEM) system in accordance with one embodiment of the present invention.

The present invention may be implemented within any suitable measurement device that directs charged particles towards a sample and then detects emitted particles from the sample. FIG. 2 is a diagrammatic representation of a scanning electron microscope (SEM) system 200 in accordance with one embodiment of the present invention. The SEM system 200 includes an electron beam generator (202 through 216) that generates and directs an incident electron beam 201 substantially toward an area of interest on a sample 224. The SEM system 200 also includes a detector 226 arranged to detect charged particles 205 (secondary electrons and/or backscattered electrons) emitted from the sample 224. The SEM also includes an image generator (not shown) for forming an image from the detected emitted particles. The electron beam generator and detector are further described below, along with other features of the SEM system 200.

The SEM system 200 may also include one or more electrodes 220 configured to control charge on the sample. Each electrode includes a hole through which the incident beam may pass. The electrode(s) are placed proximal to the sample and charged to a predetermined voltage. In general terms, the predetermined charge results in the generation of an electric field that functions to control charge on the surface of the sample.

In one embodiment, the predetermined voltage is selected to repel some of the particles emitted from the sample back towards the sample such that charge accumulated on the surface of the sample may be controlled. For example, a portion of the secondary electrons emitted from the sample are repelled back to the sample surface to cancel positive charge build up on the sample surface. The predetermined voltage is also chosen such that some of the particles emitted from the sample pass through the hole of the electrodes to the detector. In other words, the electrode's predetermined voltage is selected to allow enough emitted particles to reach the detector and image generator such that the image may be analyzed (e.g., for defects), as well as to control charge. Several electrode configurations and electrode voltage setting techniques are described in U.S. patent application Ser. No. 09/394,133 filed Sep. 9, 1999 by McCord et al., which application is herein incorporated by reference in its entirety.

The SEM system 200 also includes a mechanism for obtaining a surface charge value of a portion of the sample after it is exposed to a charged particle beam under a set of operating conditions. The surface charge value is repeatedly obtained under different operating conditions until a predefined optimum charge value is reached or until an optimum set of operating conditions may be extrapolated. The metrology or inspection procedure may then proceed using the operating conditions at which the optimum charge value was reached.

Any suitable mechanism for obtaining a surface charge value of a portion of the sample may be utilized. Preferably, a non-contact measurement device is used so as to not damage the sample. In the illustrated embodiment, an electrostatic voltmeter 228 is positioned adjacent to the sample 224. By way of a specific example, the electrostatic voltmeter may be a non-contact Kelvin probe. One such device is the PO699 electrostatic voltmeter available from Trek Inc. of Medina, N.Y. Alternatively, the surface charge may be indirectly obtained through other measurement devices, such as an energy analyzer that measures secondary electron energy. One such energy analyzer embodiment is described further below with reference to FIGS. 5, 6A, and 6B. By way of final example, an atomic force microscope (AFM) may be utilized. An AFM normally measures sample topography, but can be configured to measure surface potential.

In the illustrated embodiment, the voltmeter 228 is utilized to obtain a plurality of charge values under various sets of operating conditions of the SEM system 200. One or more of the operating conditions affect surface charge. That is, surface charge value changes with each set of operating conditions. Accordingly, the obtained charge values and associated operating conditions may then be utilized to determine which operating conditions will result in a desired charge value. Operating conditions may then be readily selected so as to obtain the desired surface charge during a metrology or inspection procedure.

Figure 3:
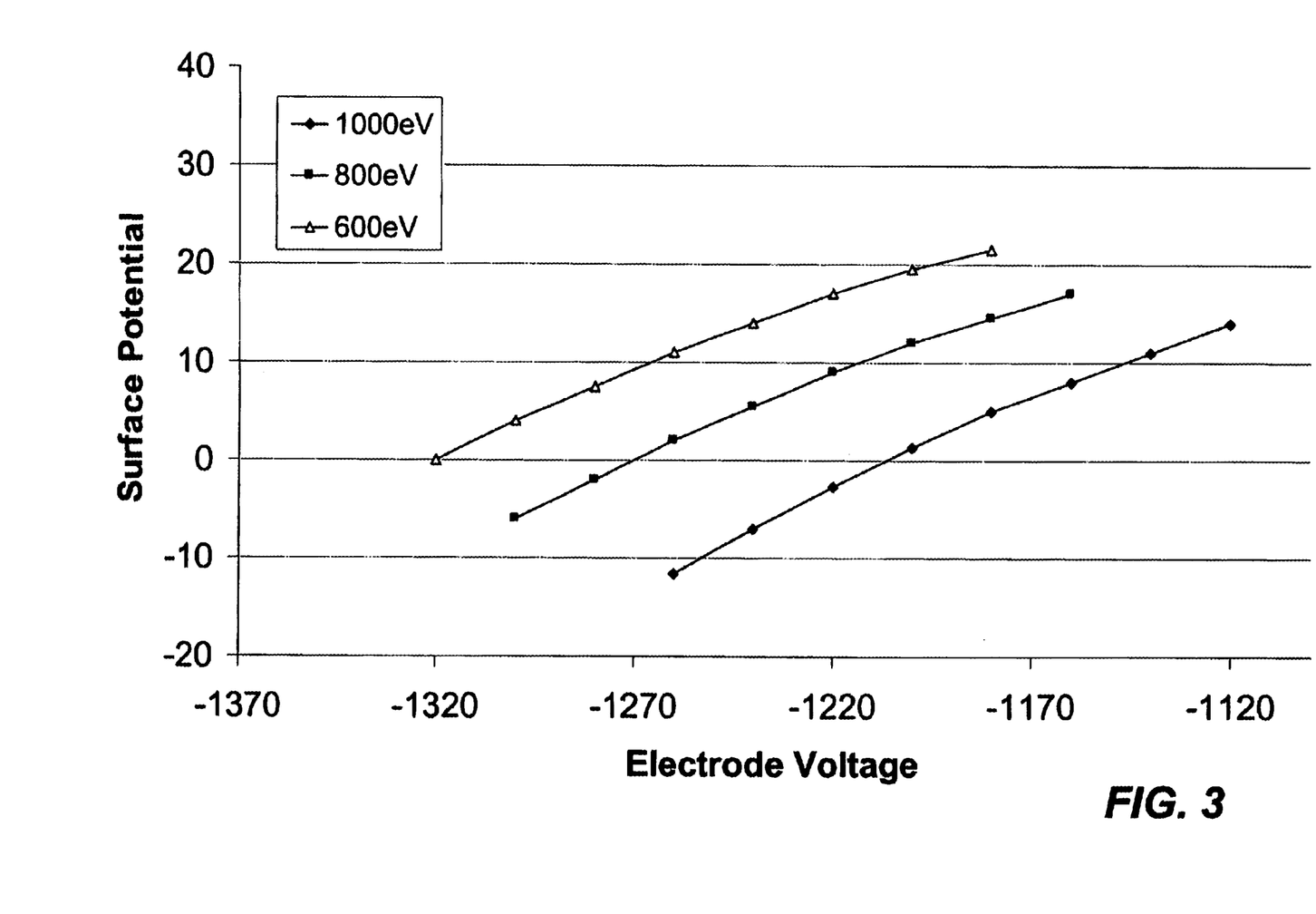
FIG. 3 is a graphical representation surface voltage values as a function of electrode voltage and landing energy.

Any suitable type and number of operating parameters may be adjusted prior to each voltmeter 228 reading. By way of examples, charge values may be obtained for various combinations of beam landing energy and electrode voltage. Other operating parameters that may be adjusted include specific configurations of the lens and electrodes within the SEM system 200. FIG. 3 is a graphical representation of measured surface voltage as a function of electrode voltage and landing energy. As shown, a different curve is generated for each landing energy value (100 eV, 800 eV, and 600 eV). For each landing energy value, a plurality of electrode voltages are selected and a plurality of corresponding surface voltages are measured. In one embodiment, the surface voltage is measured at a plurality of electrode voltages. In an alternative embodiment, the surface voltage is indirectly obtained by measuring the secondary electron energy level at a plurality of electrode voltages.

For each landing energy, a surface voltage may be measured (or indirectly obtained) for any number of electrode voltages, depending on the requirements of the particular application. In certain examples, a relatively high number of electrode voltages may be selected and resulting surface voltages measured to obtain a more accurate curve fit. After such curves are obtained, a particular landing energy and electrode voltage may then be selected from one or more curves to obtain a desired surface voltage. For instance, in certain applications image quality is optimum when surface charge is minimized. Any number of operating conditions may be selected to obtain a zero surface charge value. As shown, a landing energy of 600 eV and an electrode voltage of −1320V results in a zero surface voltage. Likewise, a landing energy of 800 eV and an electrode voltage of −1270V results in a zero surface charge.

A particular set of operating conditions may be obtained directly from an actual measurement point or extrapolated from two or more measurement points. As shown in FIG. 3, a landing energy of 600 eV and an electrode voltage of −1320V results in a measured surface voltage of 0V. In contrast, a landing energy of 800 eV and an electrode voltage of −1270V results in an extrapolated voltage of 0V.

Figure 4:
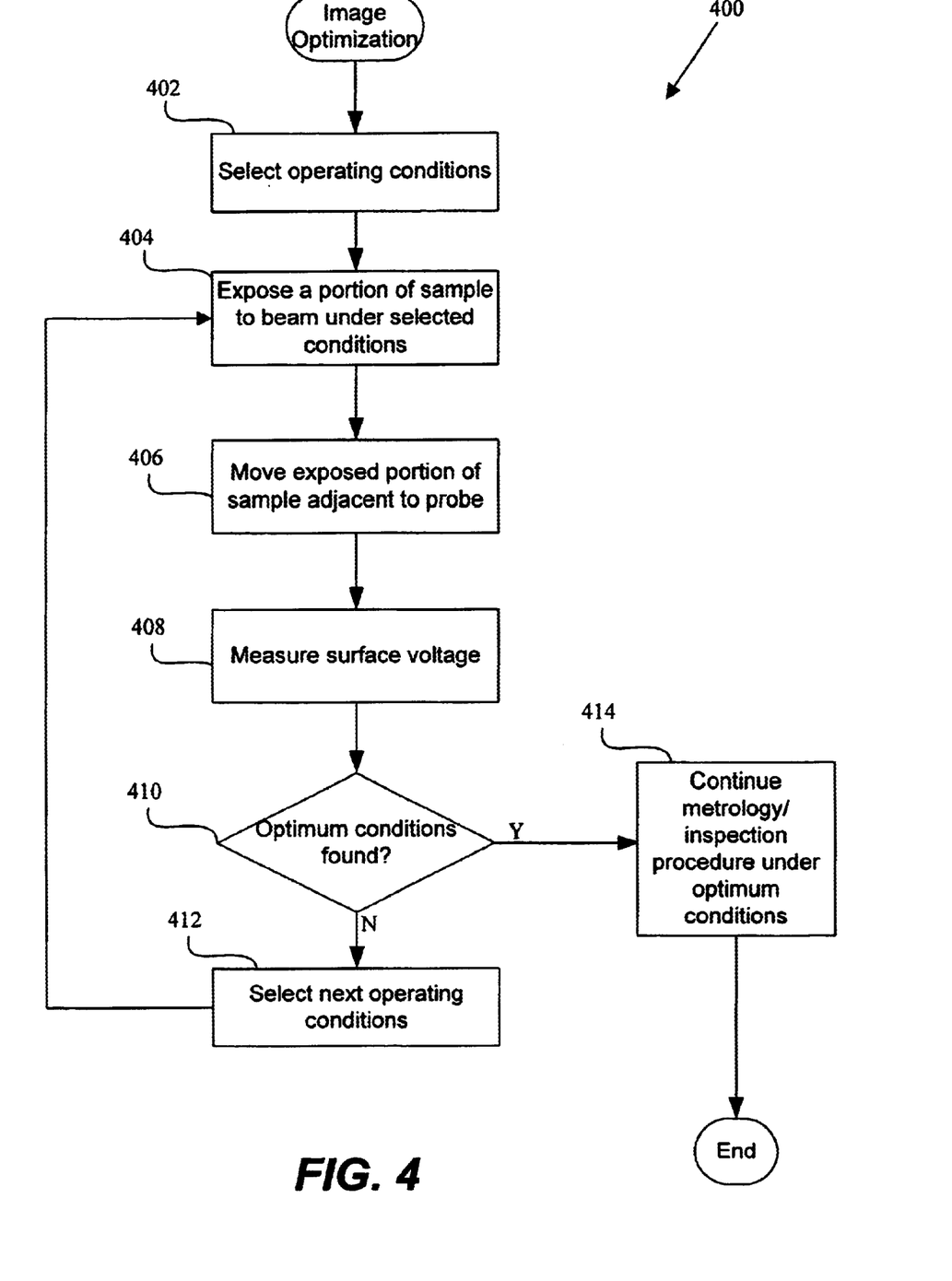
FIG. 4 is a flow chart illustrating a charge control procedure in accordance with one embodiment of the present invention.

FIG. 4 is a flow chart illustrating a charge control procedure 400 in accordance with one embodiment of the present invention. This procedure 400 may be implemented by any suitable combination of hardware and/or software, such as the computer illustrated in FIGS. 8A and 8B. Initially, a first set of operating conditions are selected in operation 402. For example, a particular landing energy and electrode voltage are selected. A portion of the sample is then exposed under the selected conditions in operation 404. The exposed portion is then moved under the voltmeter (e.g., 228) to measure the surface voltage of the exposed portion. By way of alternatives, the voltmeter is moved over the sample or the voltmeter is mounted over the exposed portion and movement is not required.

It is then determined whether optimum conditions have been obtained in operation 410. That is, it is determined whether the desired surface voltage is readily determinable. For example, the test data (e.g., landing energy, electrode voltage, and surface voltage reading) is plotted and curves (such as those illustrated in FIG. 3), are fitted around the data points. It is then determined whether one or more desired surface voltages (e.g., 0 V) may be obtained from the generated curves. In other words, data points are taken until a curve that includes one or more desired surface voltages is generated. In sum, a desired surface voltage and corresponding operating voltages may be extrapolated or taken directly from the measured surface voltages and corresponding operating conditions.

If optimum conditions are not found, a next set of operating conditions are selected in operation 412. Operations 404 through 410 are repeated for each new selection of operating conditions. When optimum conditions are found, a normal metrology or inspection procedure may then be continued or initiated in operation 414 under optimum operating conditions.

Data may be collected to determine any suitable number and type of optimum operating conditions. For example, data may be collected to determine a first set of optimum operating conditions, and then the normal metrology or inspection procedure is performed under the first optimum conditions. More data (e.g., surface voltage readings) may then be collected to determine a second set of optimum operating conditions (e.g, optimum landing energy values), and then a metrology or inspection procedure is performed under the second optimum conditions. Alternatively, data may be collected for multiple sets of optimum operating conditions, and then various metrology or inspection procedures may be performed under various sets of optimum conditions. For example, surface voltage may be measured for a plurality of sample types, landing energy values, and a plurality of electrode voltage values (See FIG. 3).

In sum, once a plurality of surface voltages are obtained for a plurality of adjustable operating parameters, one or more optimum sets of operating parameters may then be selected to obtain a particular surface voltage. The SEM system 200 may then be set to optimum operating parameters during subsequent metrology or inspection procedures on the sample from which surface voltages were obtained (e.g., operation 414). Additionally, the optimum operating parameters may also be used for any other samples that have a same sample type. In other words, the operating parameters may be utilized for any sample that affects the surface charge in a same way. For example, samples having a same sample composition, thickness, and amount of coverage of an insulator layer over an underlying conductor. Preferably, surface charge values are obtained under various operating conditions for each sample type that is to undergo charged particle analysis.

Referring back to FIG. 2, the electron beam generator may be arranged in any suitable configuration for generating an electron beam that will result in secondary electrons being emitted from the sample 224. As shown, the electron beam generator includes an electron source unit 202, an alignment octupole 206, an electrostatic predeflector 208, a variable aperture 210, a Wien filter 214, and a magnetic objective lens 216.

The source unit 202 may be implemented in any suitable form for generating and emitting electrons. For example, the source unit 202 may be in the form of a filament that is heated such that electrons within the filament are excited and emitted from the filament. The octupole 206 is configured to align the beam after a particular gun lens voltage is selected. In other words, the beam may have to be moved such that it is realigned with respect to the aperture.

The aperture 210 forms a hole through which the beam is directed. The lower quadrupole 208 may be included to compensate for mechanical alignment discrepancies. That is, the lower quadrupole 208 is used to adjust the alignment of the beam with respect to any misaligned through-holes of the SEM through which the beam must travel.

The Wien filter 214 provides a B×E field (e.g., a magnetic field's direction is perpendicular and directed away from a direction of an electric field) that is normal to the electron beam's path. The Wien filter 214 applies an E force on the beam that is opposite to the B force that is applied on the beam. Thus, the Wien filter does not substantially move the beam off axis. However, the Wien filter 214 applies the E force and B force on secondary electrons emitted from the sample in a same direction that is towards the detector 226. Thus, the Wien filter 214 deflects secondary electrons towards the detector 226. The Wien filter 214 and/or octupole 206 and/or quadrapole 208 may be configured to direct the beam across an area of the sample. By setting the X and Y scan voltages, a particular beam pattern may be selected. The deflection system may include a processor that may be also configured to control voltage settings on the electrodes, as well as scan voltages, as a function of incident beam position.

The magnetic objective lens 216 provides a mechanism for accelerating the beam towards the sample. A plurality of electrostatic lens (not shown) may provide fast focus of the beam onto the sample surface. The SEM system 200 may include a support (not shown) or stage for supporting the sample 224.

The SEM system 200 includes a detector 226. The SEM system 200 also includes an image generator (not shown) arranged to receive the detected signal and generate and/or store an image. The detected signal is then used to generate the image. Thus, the SEM system 200 may also include an analog to digital converter for converting the detected signal into a digital signal. The SEM system 200 may also include a computer system for processing the image frame data to generate an image of the sample. For example, successive image frame data may be averaged together to create the image. The computer may also be configured to set various operating conditions, analyze surface voltage values under various operating conditions, and determine optimum operating conditions based on such analysis.

Figure 5:
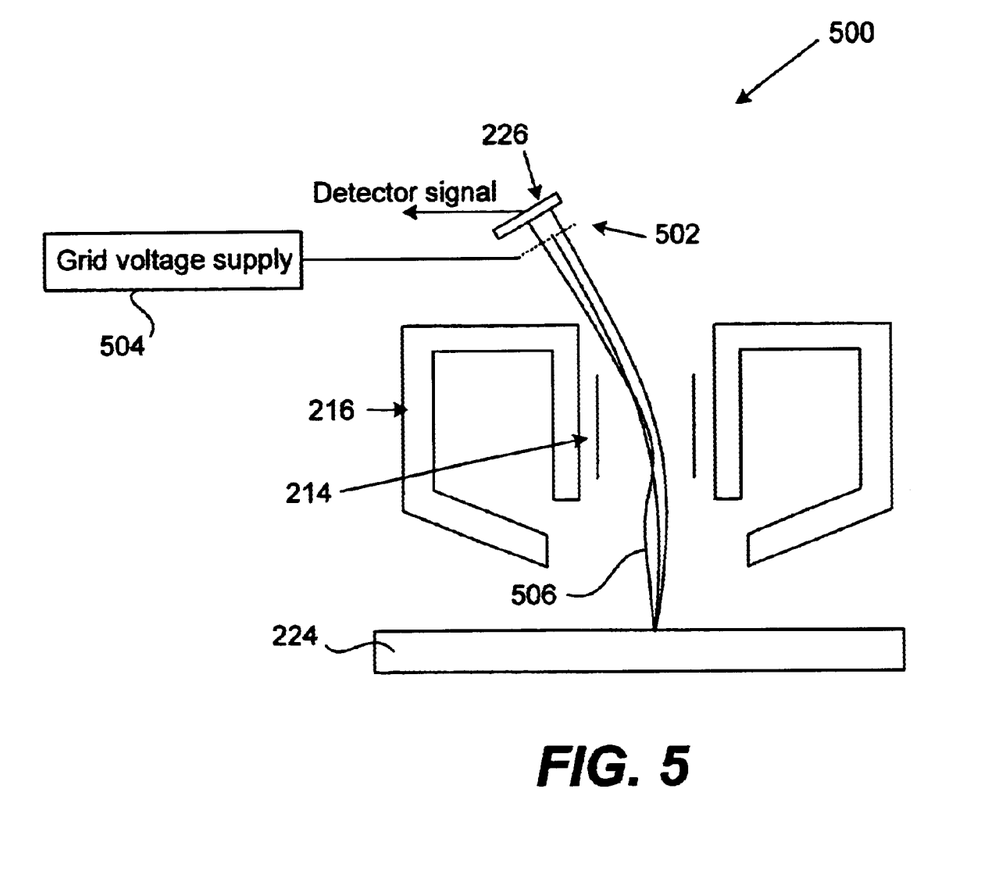
FIG. 5 is a diagrammatic representation of a portion of a scanning electron microscope (SEM) system in accordance with an alternative embodiment of the present invention

FIG. 5 is a diagrammatic representation of a portion of a scanning electron microscope (SEM) system 500 in accordance with an alternative embodiment of the present invention. The SEM system 500 includes many of the same components as the SEM system 200 of FIG. 2. For example, the SEM system 500 includes an electron beam generator (not shown) that generates and directs an electron beam substantially toward an area of interest on a sample 224. The SEM system 500 also includes a detector 226 arranged to detect charged particles 506 (secondary electrons and/or backscattered electrons) emitted from the sample 224. The SEM also includes an image generator (not shown) for forming an image from the detected signal of the detector 226.

As an alternative to the electrostatic voltmeter of FIG. 2, the SEM system 500 has an energy analyzer arranged to measure the energy of the secondary electrons. The energy analyzer may be arranged separately from the detector 226 or the detector 226 may form part of the energy analyzer. As shown, the energy analyzer includes the detector 226 and a grid 502 placed within the path of the emitted secondary electrons. The grid that is coupled with a grid voltage supply 504 for adjusting the grid's voltage and energy. In general terms, only secondary electrons having an energy greater than the grid's energy pass through the grid and are collected by detector 226.

Figure 6A:
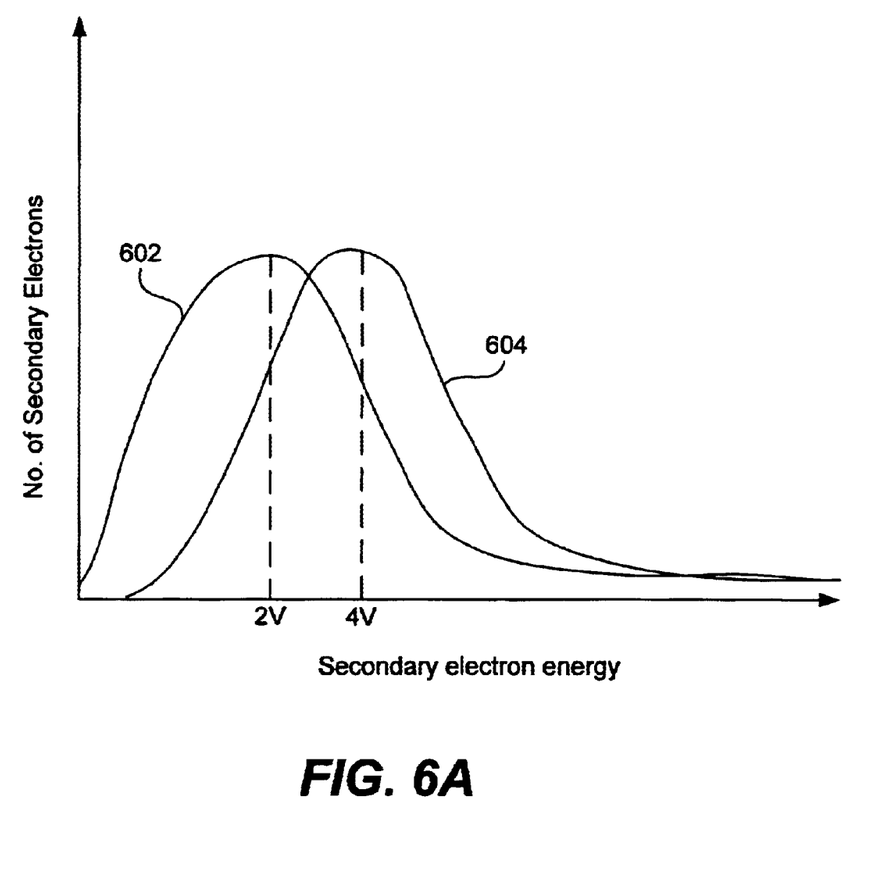
FIG. 6A is a graphical representation of the number of secondary electrons as a function of secondary electron energy and surface charge.

The voltage and energy of the grid may be adjusted to obtain a profile of the secondary electrons as a function of energy as shown in FIG. 6A. The peak of each curve shifts to the right as a function of surface charge build up. For example, curve 602 is a profile of a sample having zero charge build up and a peak at 2V. Curve 604 is a profile of a sample having a peak at 4V. This difference between peaks (4V–2V) is proportional to the amount of charge build up on the sample. When the operating conditions are adjusted the resulting curve shifts accordingly. That is, each set of operating conditions results in a secondary electron energy profile having particular peak value that may be utilized to determine the amount of charge build up. The operating conditions may then be varied to obtain an optimum surface charge level. The grid's voltage and energy may also be set to zero so that none of the secondary electrons are inhibited from reaching the detector 226 and metrology or inspection procedures may be performed.

Figure 6B:
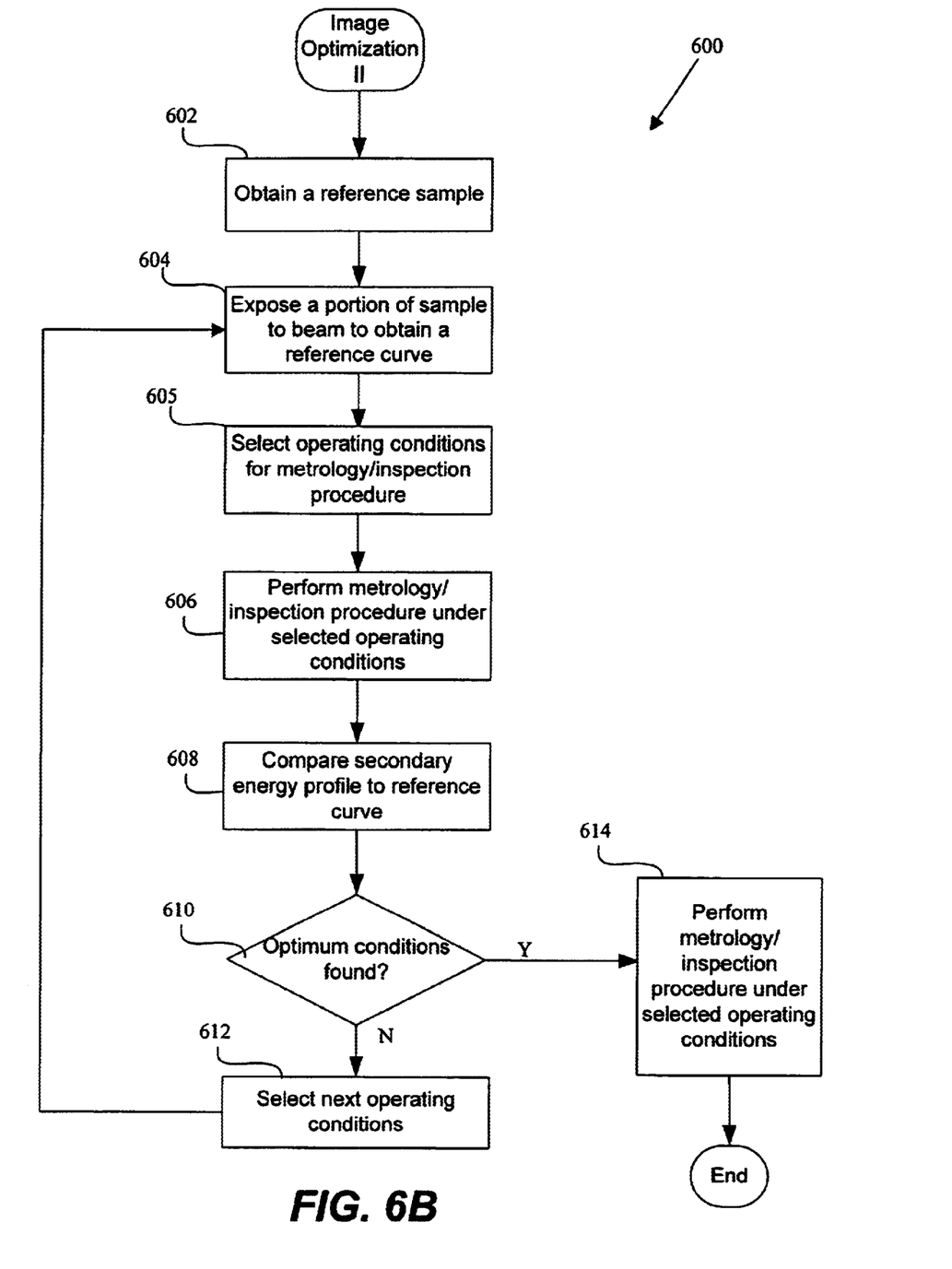
FIG. 6B is a flow chart illustrating an image optimization procedure in accordance with a second embodiment of the present invention.

FIG. 6B is a flow chart illustrating an image optimization procedure 600 in accordance with a second embodiment of the present invention. This procedure 600 may be implemented with any suitable combination of hardware and software, such as the computer of FIGS. 8A and 8B. Initially, a reference sample is obtained in operation 602. The reference sample has a known charge build up level. For example, an insulator sample with no charge or a conductive sample is used to obtain a reference curve for a zero surface charge.

A portion of the sample is then exposed to obtain the reference curve (e.g., 602 of FIG. 6A). For example, the voltage and energy of the grid is incremented so that a variable number of secondary electrons pass through the grid to the detector. That is, for each energy value of the grid, only secondary electrons having an energy greater than the grid energy pass through the grid. The number of secondary electrons are determined from the measured intensity of the detected signal output from the detector. When the number of secondary electrons is plotted as a function of secondary electron (or grid) energy, the resulting curve has a peaked shape.

After the reference curve is obtained, a set of operating conditions are then selected for the metrology or inspection procedure in operation 605, which procedure is then performed in operation 606. A second energy profile of the secondary electrons is then obtained in operation 608 (e.g., 604 of FIG. 6A). This profile is then compared to the reference profile in operation 608. It is then determined whether optimum conditions have been reached in operation 610. For example, it is determined whether the energy peak of the second energy profile has about the same voltage as the peak of the reference profile.

If optimum conditions have not been reached, a next set of operating conditions are then selected in operation 612. Operations 604 through 610 are repeated under different operating conditions until optimum operating conditions are reached. When optimum conditions are reached, the metrology or inspection procedure may then continue under the currently selected operating conditions in operation 614.

The energy analyzer may take any other suitable form for determining the energy of the secondary electrons. For example, a retarding grid analyzer may be implemented. The energy analyzer may be integrated with the detector 226 or placed at a different orientation than the detector 226 (180 degrees works well). Any suitable beam deflector may be utilized to direct the secondary electrons to either the detector or the energy analyzer. The Wien filter 214 may then be utilized to direct the secondary electrons to either the detector 226 or the retarding grid analyzer. A retarding grid analyzer generally includes a wire mesh over a metal faraday cup. A variable voltage is applied to the mesh to obtain the secondary electron energies. Alternatively, a hemispherical spectrometer (such as the CLASS WA by VSW Micro Photonics of Allentown, Pa.) may provide a more accurate measurement of secondary electron energies.

Although the invention has been described as being implemented on the SEM systems 200 of FIG. 2 and 500 of FIG. 5, of course, other SEM systems may be implemented. By way of example, the source may expel electrons at an energy that is substantially equal to the final landing energy value, and the electrons are then accelerated through a series of lens that are set at large positive potentials. As the electrons are expelled from the series of lens, the electrons then slow down and hit the sample at the final landing energy. The series of lenses may throw out a large extraction field out of the objective lens, which acts to decelerate the electron beam, while accelerating the secondary electrons that are emitted from the sample. Additionally, the present invention may be implemented on similar measurement devices to control surface charge build up. Although the present invention has been described as utilizing electrons, of course, positively charged particles may be utilized in the metrology or inspection device.

In sum, the present invention may include any suitable mechanism for determining surface charge and determining whether such surface charge is at a desired level. The operating conditions of the charged beam measurement device (e.g., SEM) may then be adjusted until the desired surface charge is obtained. The surface charge may be determined directly by measuring the surface potential as described above with reference to FIG. 4. Alternatively, the surface charge may be obtained indirectly in numerous ways, such as measuring the energy of secondary electrons as described with reference to FIGS. 6A and 6B.

Another indirect mechanism utilizes focus settings to determine whether surface charge is at a desired level. The reason for this is that focus settings depend on surface charge levels. Different charge values result in different focus settings for obtaining the best focused image. For example, a first surface value results in a first focus length to achieve an optimum image, and a second charge value results in a second focus length. If a particular focus setting can be correlated with a desired surface charge value, the operating conditions of the charged beam device may be adjusted until this particular focus setting is reached.

Figure 7:
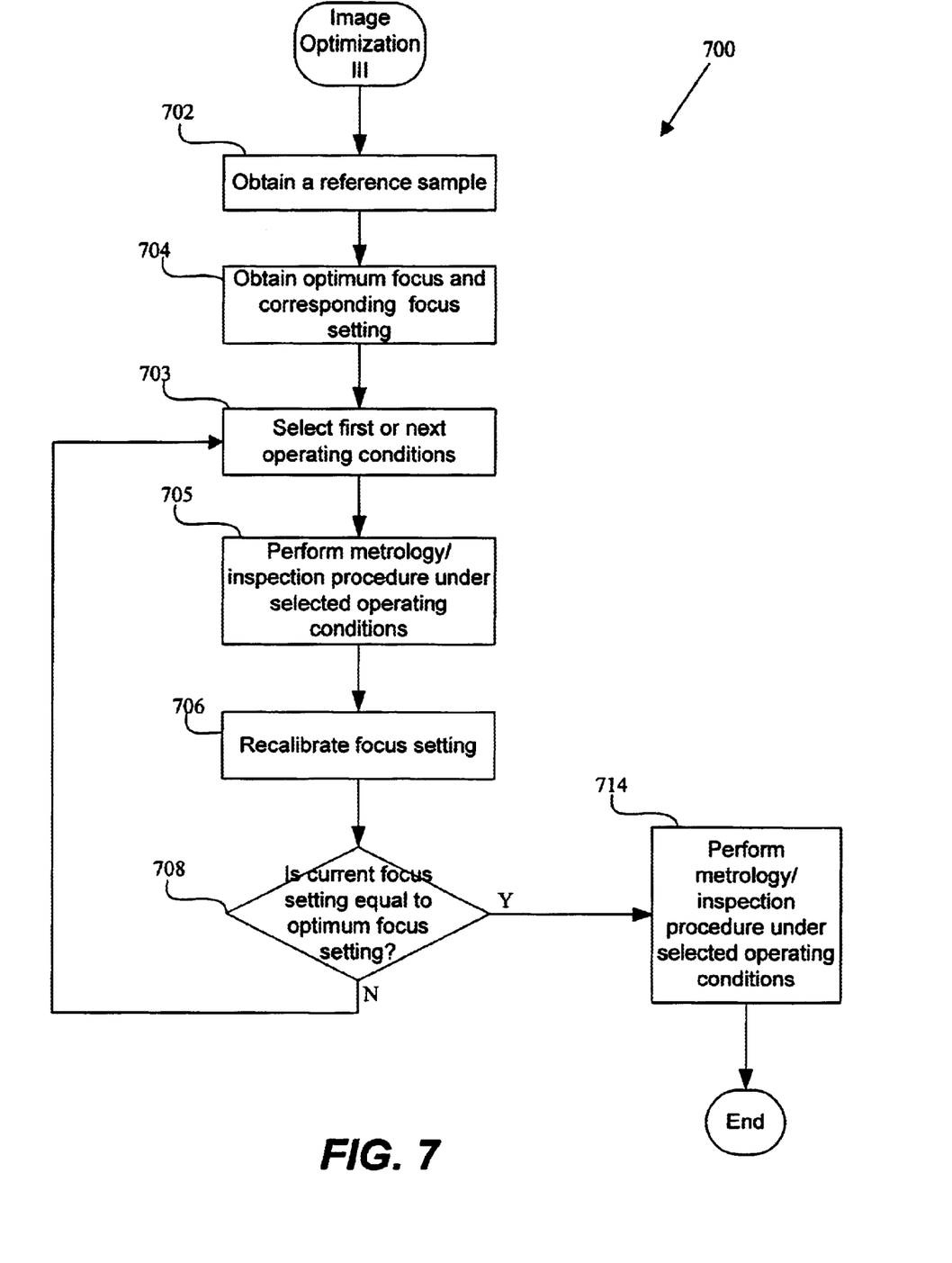
FIG. 7 is a flow chart illustrating an image optimization procedure in accordance with a third embodiment of the present invention.

FIG. 7 is a flow chart illustrating an image optimization procedure 700 in accordance with a third embodiment of the present invention. Initially, a reference sample is obtained in operation 702. The reference sample has a known charge potential (e.g., zero charge). The reference sample may be the same sample that is to undergo a metrology or inspection procedure. Alternatively, the reference sample may differ from the sample that is to undergo the metrology or inspection procedure. An optimum focus and the corresponding optimum focus setting are then obtained in operation 704.

Optimum focus is generally defined as the sharpest possible image. That is, the image is rendered distinct. The dark and light portions of the image are generally identifiable as such. Optimum focus may be achieved by any suitable mechanism and is device dependent. For example, the optimum focus may be obtained by adjusting the current through the magnetic objective lens of the SEM (e.g., 216 of FIG. 2). Alternatively, the voltages on one or more charge control electrodes (e.g., 220) may be adjusted. By way of further alternatives, one or more lens configuration (e.g., the magnetic lens or gun lenses) and/or the bias applied to the sample may be altered to thereby affect the focus. The beam energy at which the electrons come out of the gun may also be adjusted to affect the focus. One or more of these focus settings (e.g., lens current, charge control electrode voltages, lens configuration, sample bias, beam energy, etc.) are repeatedly adjusted until the optimum focus is reached for the reference sample. The focus setting that corresponds to this optimum focus is defined as the optimum focus setting.

A first set of operating conditions for the charged beam device are then selected in operation 703. For example, a landing energy and one or more charge control voltages are set. A metrology or inspection procedure is then performed on the reference sample or on a substantially identical sample in operation 705. The focus setting is then recalibrated in operation 706. That is, the focus setting is adjusted (or not adjusted if optimum focus is already reached) to achieve optimum focus. It is then determined whether the current focus setting is equal to the optimum focus setting previously obtained for the reference sample in operation 708.

If they are not equal, a next set of operating conditions are then selected in operation 703. Operating conditions are adjusted until the recalibrated focus setting matches the optimum focus setting in operation 708. When this occurs, the metrology or inspection procedure may then be performed under the selected operating conditions in operation 714. Since these operating conditions are chosen such that the focus setting corresponds to the optimum focus setting of the reference sample, the desired surface charge level has also been reached. Thus, the metrology or inspection procedure can continue under optimum surface charge levels so that the image clarity is also optimized.

Figure 8A:
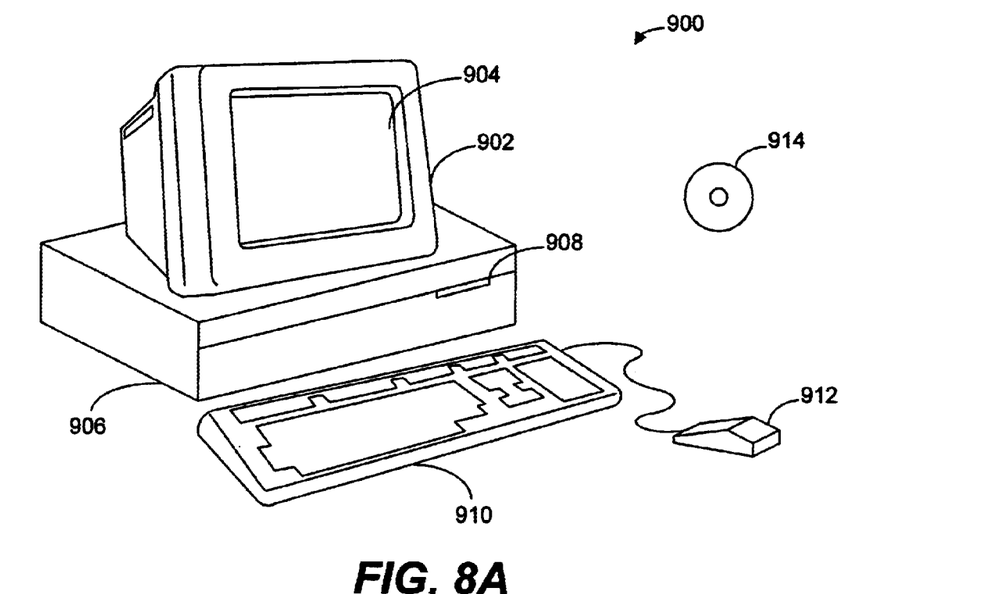
FIGS. 8A and 8B illustrate a computer system suitable for implementing embodiments of the present invention.
Figure 8B:
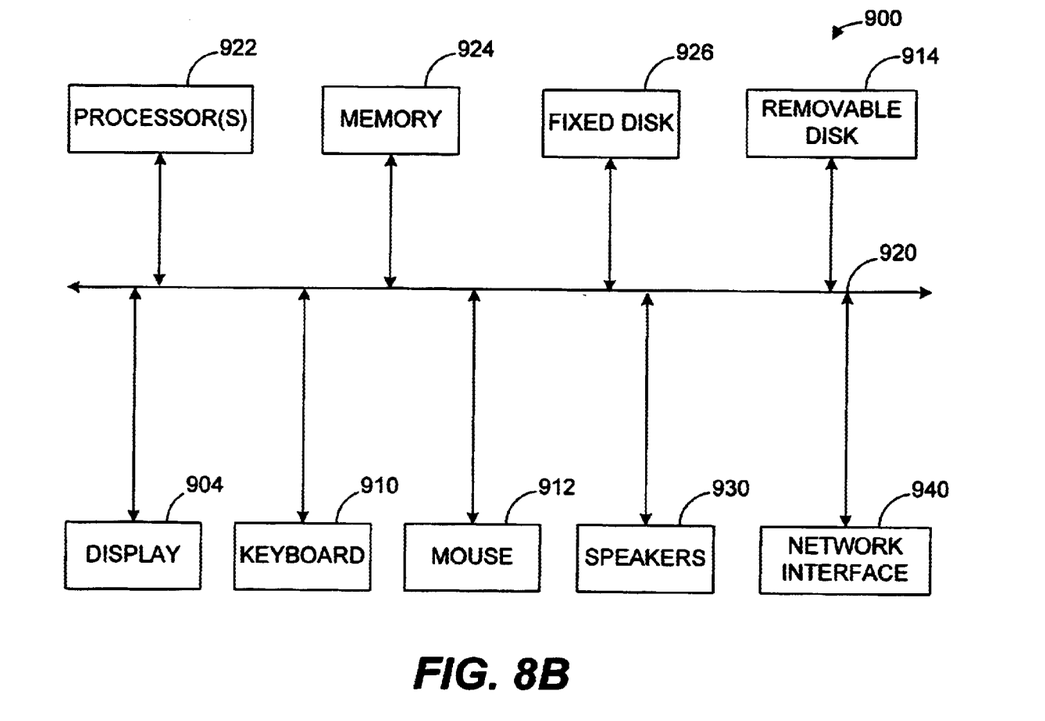

FIGS. 8A and 8B illustrate a computer system 900 suitable for implementing embodiments of the present invention. For example, the computer system 900 may be configured or programmed to control various operating parameters of an electron beam device (e.g., FIGS. 2 and 5). Additionally, the software may be configured to obtain surface voltage measurements under various operating conditions and analyze the surface voltage measurements to determine a set of optimum operating conditions. The computer system 900 may also direct metrology and inspection procedures.

FIG. 8A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 8B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the sample may be any substance or object that is suitable for charged particle inspection, such as a semiconductor wafer, a reticle, or a biological sample. Additionally, the present invention may be especially useful in inspecting thin film heads within hard disks, which are being designed with smaller and smaller dimensions.

Accordingly, the present embodiments are to be considered as illustrative and not restrictive, and the invention is not to be limited to the details given herein, but may be modified within the scope and equivalents of the appended claims.

What is claimed is:

1. An apparatus for generating an image from a sample during an metrology or inspection procedure, comprising:
   a charged particle beam generator arranged to direct a charged particle beam towards a portion of the sample;
   a detector arranged to detect charged particles originating from the sample portion to allow generation of an image from the detected charged particles;
   a measurement device arranged to obtain a surface voltage value of the sample portion that is exposed to the charged particle beam, wherein the detector is operationally independent from the measurement device; and
   a processor and at least one memory operable to:
   (a) cause the charged particle beam generator to direct a charged particle beam towards a portion of the sample under a set of operation conditions;
   (b) obtain the surface voltage value of the sample portion from the measurement device;
   (c) compare the obtained surface voltage to a predefined optimum surface voltage;
   (d) when the obtained surface voltage is not substantially equal to the predefined optimum surface voltage, adjust one or more operating conditions of the charged particle beam generator so as to alter the obtained surface voltage value and repeat operations (a) through (d) until the obtained surface voltage is substantially equal to the predefined optimum surface voltage, and
   (e) when the obtained surface voltage is substantially equal to the predefined optimum surface voltage, define the current operating conditions of the charged particle beam generator as the optimum operating conditions and inspect the sample portion with the charged particle beam under the optimum operating conditions.

2. An apparatus as recited in claim 1 wherein the measurement device is an electrostatic voltmeter arranged to measure a surface voltage of the sample portion.

3. An apparatus as recited in claim 2 wherein the measurement device is movable to a position adjacent to the sample portion and to a second position not adjacent to the sample portion.

4. An apparatus as recited in claim 2 wherein the sample is movable to a position adjacent to the measurement device and to a second position not adjacent to the measurement device.

5. An apparatus as recited in claim 2 wherein the electrostatic voltmeter takes a form of a Kelvin probe.

6. An apparatus as recited in claim 1 wherein the measurement device is a charge analyzer arranged to obtain an energy profile of the detected charged particles and the apparatus further comprises a processor arranged to determine the surface voltage of the sample portion from the energy profile of the detected charged particles.

7. An apparatus as recited in claim 6 wherein the charge analyzer is arranged at a different orientation than the detector and the apparatus further includes a beam deflector configurable to direct the charged particles originating from the sample either to the detector or the charge analyzer.

8. An apparatus as recited in claim 7 wherein the beam deflector is a Wien filter.

9. An apparatus as recited in claim 8 wherein the charge analyzer includes a mesh coupled to a voltage supply and a faraday cup arranged to collect charged particles originating from the sample portion that pass through the mesh.

10. An apparatus as recited in claim 6 wherein the measurement device and the detector are together configurable to measure the energy profile of the detected charged particles of the sample portion to obtain a surface voltage value of the sample portion.

11. An apparatus as recited in claim 10 wherein the measurement device is a grid coupled to a voltage supply.

12. An apparatus as recited in claim 8 wherein the charge analyzer is a hemispherical spectrometer.

13. An apparatus as recited in claim 1 wherein the image is used for a metrology analysis of the sample.

14. An apparatus as recited in claim 1 wherein the image is used for an inspection of the sample.

15. A method of controlling charge on a sample, the method comprising:
(a) directing a charged particle beam substantially towards a portion of the sample under a set of operating conditions that result in a surface charge value on the sample portion;
(b) measuring the surface charge value of the sample portion under the first set of operating conditions;
(c) comparing the measured surface charge value to an optimum surface charge value;
(d) when the measured charge value does not substantially equal the optimum surface charge value and the optimum surface charge value cannot be extrapolated from previously measured charge values, adjusting the set of operating conditions to a current set of operating conditions and repeating operations (a) through (d); and
(e) when the measured charge value does substantially equal the optimum surface charge value or the optimum surface charge value can be extrapolated from previously measured charge values, defining the current set of operating conditions as an optimum set of operating conditions and inspecting the sample portion with the charged particle beam under the optimum set of operating conditions.

16. A method as recited in claim 15 wherein the set of operating conditions include a landing energy value of the charged particle beam.

17. A method as recited in claim 15 wherein the set of operating conditions include an electrode voltage of an electrode that is placed adjacent to the sample portion, the electrode being arranged to control charge on the sample portion.

18. A method as recited in claim 17 wherein the set of operating conditions include a configuration of the electrode.

19. A method as recited in claim 15 wherein the first operating conditions include a configuration of one or more lens of the source unit.

20. A method as recited in claim 15 wherein the first operating conditions include a sample type.

21. A method as recited in claim 20 wherein the sample type is selected from a group consisting of sample composition, sample thickness, and percentage coverage of insulator material over conductive material.

22. A method as recited in claim 15 wherein the surface voltage value is obtained by (i) generating a reference energy profile of the detected particles for a reference sample having the predetermined surface voltage value, (ii) generating a comparison energy profile for the detected particles for the sample portion under the first set of operating conditions, and (iii) comparing a peak of the reference energy profile with a peak of the comparison profile to obtain a voltage difference equal to a difference between the surface voltage value and the predetermined surface voltage.

23. A method as recited in claim 22 wherein the optimum operating condition is found when the difference is substantially zero.

24. A computer readable medium containing program instructions for controlling charge build up on a sample while an image is being generated of a portion of the sample with a charged particle device having a source unit for directing a charged particle beam substantially towards the sample, a detector for detecting particles that are output from the sample, and an image generator for generating the image of the sample from the detected particles, the computer readable medium comprising:
computer code for (a) directing a charged particle beam substantially towards a portion of the sample under a set of operating conditions that result in a surface charge value on the sample portion;
computer code for (b) measuring the surface charge value of the sample portion under the first set of operating conditions;
computer code for (c) comparing the measured surface charge value to an optimum surface charge value;
computer code for adjusting the set of operating conditions to a current set of operating conditions and repeating operations (a) through (d) when the measured charge value does not substantially equal the optimum surface charge value and the optimum surface charge value cannot be extrapolated from previously measured charge values; and
computer code for defining the current set of operating conditions as an optimum set of operating conditions and inspecting the sample portion with the charged particle beam under the optimum set of operating conditions when the measured charge value does substantially equal the optimum surface charge value or the optimum surface charge value can be extrapolated from previously measured charge values.

25. A method of controlling charge build up on a test sample that is to undergo a metrology or inspection procedure within a charged particle device, the method comprising:
(a) in a charged particle device, calibrating a focus setting of a charged particle device to obtain a first optimum image of a reference sample having a known surface charge value, the first optimum image corresponding to a first optimum focus setting;
(b) selecting a set of operating conditions for the charged particle device;
(c) in the charged particle device, directing a charged particle beam towards a test sample under the selected set of operating conditions, the test sample being the same or substantially identical to the reference sample;
(d) in the charged particle device, calibrating the focus setting of the charged particle device to obtain a second optimum image of the test sample, the second optimum image corresponding to a second optimum focus setting;

(e) comparing the second optimum focus setting to the first optimum focus setting;

(f) when the second optimum focus does not substantially equal the first optimum focus setting, adjusting the set of operating conditions and repeating operations (c) through (f) under the adjusted set of operating conditions; and (f) when the second optimum focus setting substantially equals the first optimum focus setting, commencing with inspection or metrology of the test sample by directing the charged particle beam towards the test sample under the adjusted set of operating conditions to thereby result in the test sample having a surface charge substantially equal to the known surface charge value of the reference sample.

26. A method as recited in claim 25 wherein the test sample is the reference sample.

27. A method as recited in claim 25 wherein the test sample is substantially identical to the reference sample.

28. A method as recited in claim 25 wherein the focus setting is calibrated by altering a current value through an objective lens of the charged beam device.

29. A method as recited in claim 25 wherein the operating condition includes one or more voltage values of one or more charge control electrodes of the charged beam device.

30. A method as recited in claim 25 wherein the operating condition includes a lens configuration of the charged beam device.

31. A method as recited in claim 25 wherein the operating condition includes a voltage value of the sample.

* * * * *